United States Patent [19]

Barley et al.

[11] 4,002,969
[45] Jan. 11, 1977

[54] OPTIMUM LENGTH TRANSMISSION LINE DISCRIMINATOR WITH LOW NOISE DETECTOR

[75] Inventors: Thomas A. Barley; Gustaf J. Rast, Jr., both of Huntsville, Ala.; James R. Ashley, Colorado Springs, Colo.

[73] Assignee: The United States of America as represented by the Secretary of the Army, Washington, D.C.

[22] Filed: Jan. 26, 1976

[21] Appl. No.: 652,445

[52] U.S. Cl. .............................................. 324/57 N
[51] Int. Cl.² ...................................... G01R 27/00
[58] Field of Search ..................... 324/57 N, 57 R; 328/166, 165; 325/67, 363; 178/DIG. 12

[56] References Cited
UNITED STATES PATENTS

| 3,675,124 | 7/1972 | Ashley et al. | 324/57 N |
| 3,693,076 | 9/1972 | Nugent et al. | 324/57 N |

Primary Examiner—Stanley T. Krawczewicz
Attorney, Agent, or Firm—Nathan Edelberg; Robert P. Gibson; Freddie M. Bush

[57] ABSTRACT

Measurement apparatus using an optimum length transmission line discriminator is disclosed which allows near carrier frequency modulation to be measured in the very high and ultra high frequency regions without the use of a microwave type cavity resonator or a tuned resonant circuit. Amplitude modulation rejection through direct current biasing of a quadrature detector enhances near carrier FM measurement. Signal energy is routed through two channels to the quadrature detector. A reference channel provides attenuation and phase shifting, and a signal channel comprising the optimum length line provides FM discrimination. The phase detector is direct current biased to separate amplitude modulation noise from near carrier frequency modulation noise.

6 Claims, 4 Drawing Figures

OPTIMUM LENGTH TRANSMISSION LINE DISCRIMINATOR WITH LOW NOISE DETECTOR

DEDICATORY CLAUSE

The invention described herein may be manufactured, used, and licensed by or for the Government for governmental purposes without the payment to us of any royalties thereon.

BACKGROUND OF THE INVENTION

The use of frequency discrimination to measure near carrier frequency modulation noise of a microwave signal is discussed by Ashley et al in the IEEE Transactions on Microwave Theory and Techniques, Volume MTT-16, No. 9, September 1968, pages 753–760. Prior art discrimination at microwave frequencies, as described in this paper, depended on a microwave cavity as a resonant circuit. Prior art discrimination at very high frequencies (VHF) utilize such components as slope detectors and ratio detectors, depending on the lumped circuit elements of inductance and capacitance, to form resonant circuits. At ultrahigh frequencies (UHF) between the VHF and microwave region, there is little prior art on such discrimination means. Most measurements in this area are made by heterodyning the UHF signal with a local oscillator to obtain a VHF signal which is analyzed with a discriminator at the VHF frequency range. Accounting for frequency modulation (FM) noise of the local oscillator is a well established problem in these areas. Both the cavity method and the lumped circuit element method obtains a rejection of residual amplitude modulation (AM) noise on the signal under test; for example, the VHF discriminator usually employs a limiter or ratio detector. The microwave cavity discriminator rejects AM noise and also allows the input signal level to be increased, and provides the greatest discriminated output to improve the signal-to-threshold ratio, with the threshold being the lowest value of noise established or obtained within the analyzer system.

Among the discriminators discussed in prior art literature which might be useful in obtaining FM noise measurements at UHF or lower microwave frequencies is the transmission line discriminator as has been noted by R. A. Campbell in "Stability Measurement Techniques in the Frequency Domain," IEEE-NASA Symposium on Short Term Frequency Stability, NASA SP-80, November 23–24, 1964, pages 231–235. Various aspects of detection equipment and calibration are disclosed. Also, in the IEEE Transactions on Microwave Theory and Techniques, Volume MTT-23, No. 9, September 1975, pages 776–778, an article entitled "Single Hybrid Tee Frequency Discriminator" by J. Nigrin et al discloses a discriminator tuned by a movable short and has properties comparable to those of a phase discriminator. Additional prior art includes U.S. Pat. No. 3,675,124 entitled "Apparatus for Measuring Frequency Modulation Noise Signals and for Calibrating Same" by J. R. Ashley et al. This apparatus employs an auxiliary injection phase-locked oscillator driven by a test oscillator and relies on a discriminator cavity resonator which must be accurately tuned to the exact operating frequency for acceptable operation. Ashley et al discusses in column 6 the difficulty of making signal measurements where limited power outputs make prior art methods ineffective.

SUMMARY OF THE INVENTION

In measurement of near carrier low level FM noise of a microwave signal an optimum length transmission line discriminator provides broadband measurement using an optimum length transmission line and direct current biasing of a quadrature detector to enhance signal measurement. Unwanted amplitude modulation of the input signal is effectively rejected by improving balance of a quadrature detector through adjustable biasing to suppress the AM with respect to the low noise FM signal. The threshold, or internal system noise is established during measurement tests. The optimum sensitivity is obtained from the optimum length transmission line and AM rejection is improved by the biasing of the detector circuit.

DESCRIPTION OF THE PREFERRED EMBODIMENT

Figure 1:
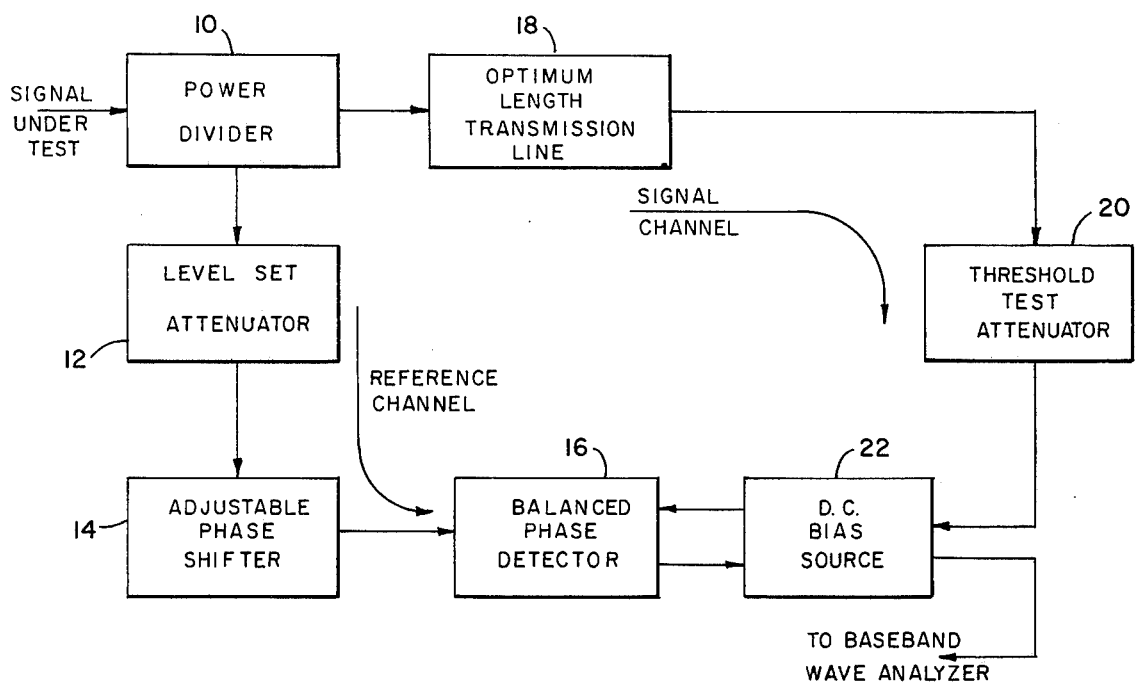
FIG. 1 is a block diagram of a preferred embodiment of the transmission line discriminator with low noise detection.

Referring now to the drawings wherein like numerals denote like parts, FIG. 1 discloses a preferred embodiment of the discriminator with low FM noise detection. A signal whose near carrier FM sidebands are to be measured is coupled into a power divider 10. Power divider 10 can be any one of several different elements such as a directional coupler, a hybrid, or a 3 db power splitter. The basic function performed by the power divider is that of dividing the incoming signal into two appropriate paths — the signal channel and the reference channel.

In the reference channel, the coupled signal is applied to an attenuator 12 which provides adjustable signal power to a balanced phase detector 16. The output of attenuator 12 is coupled into a phase shifter 14 which allows the reference channel signal to be shifted in phase with respect to the signal in the signal channel. The output of phase shifter 14 is connected to the balanced phase detector 16. This reference channel provides a means of both amplitude and phase adjustment with respect to the signal channel at the phase detector.

In the signal channel, the other coupled signal from power divider 10 is applied to an optimum length transmission line 18 which converts changes in the near carrier sideband frequency being measured into a phase change which can be quadrature detected in balanced phase detector 16. The output from optimum transmission line 18 is coupled through a threshold test attenuator 20 to balanced phase detector 16. Threshold test attenuator 20 permits operation of balanced phase detector 16 at a sufficiently low signal level to establish the system noise threshold power level.

Balanced phase detector 16 can be any device providing a quadrature detection response at the output of the device, such as a single balanced mixer or a double balanced mixer. The output of balanced phase detector 16 is analyzed using the necessary amplification, bandpass filtering and recording devices normally used in the prior art to extract baseband data (not shown). Normal baseband operation will comprise a low noise amplifier, a video spectrum analyzer with selectable bandwidths and a readout device such as an x-y plotter. Operation of the phase detector requires the detector to reject amplitude modulation without impairing the detection of frequency modulated signals. This function is accomplished by using a bias source 22 to provide appropriate balance in the mixer diodes of balanced phase detector 16 to effectively balance out amplitude modulation components.

All known near carrier mensuration techniques are restricted to operating on only one signal frequency source at a time. Thus the signal must be either a known signal or it can be easily obtained by using a bandpass filter (not shown) on the input to power divider 10.

Figure 2:
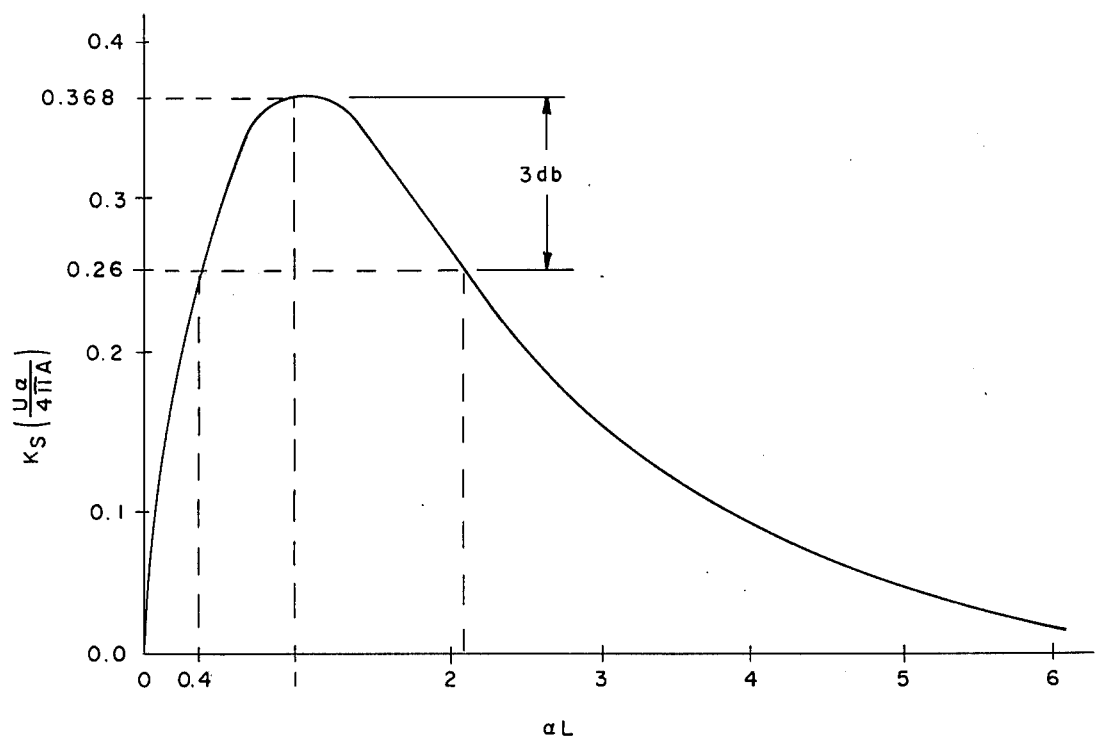
FIG. 2 is a curve of the optimum length transmission line sensitivity.

The length of optimum length transmission line 18 is always determined at a particular, selectable frequency. For the selected frequency the optimum length line is always the electrical length of line at which line attenuation is 1 neper (8.68 decibles). The normalized line sensitivity is shown in FIG. 2 and the broad bandpass is apparent from the broad peak of the curve. The optimum length of the line occurs when $\alpha L = 1.0$ and gives maximum sensitivity to the measurement apparatus. Since $\alpha$ varies slowly, being approximately proportional to the square root of frequency, this particular characteristic allows near optimum operation over a considerable frequency range without appreciable degradation in the analyzer operation. Allowing a sensitivity degradation of up to 3 db permits the usable frequency range of a particular length to be more than four octaves. The transmission line length is L, attenuation per unit length is $\alpha$, line transmission velocity is U, A is the amplitude in volts of the signal applied to the transmission line, and $K_s = \Delta v/\Delta f$ is the discriminator sensitivity in volts ($\Delta v$) per Hertz deviation ($\Delta f$). Utilizing 3 db sensitivity degradation as the controlling factor for maximum bandwidth, the optimum line length allows an operating frequency range within 0.4 to 2.1 nepers of total attenuation, corresponding to a $(2.1/0.4)^2 = 27.6$ frequency range, to be satisfactorily obtained. Obviously several selected optimum length transmission lines, such as coaxial cable can be utilized to provide a family of optimum length lines with overlapping attenuation curves to cover a very broad frequency measurement range.

Figure 3:
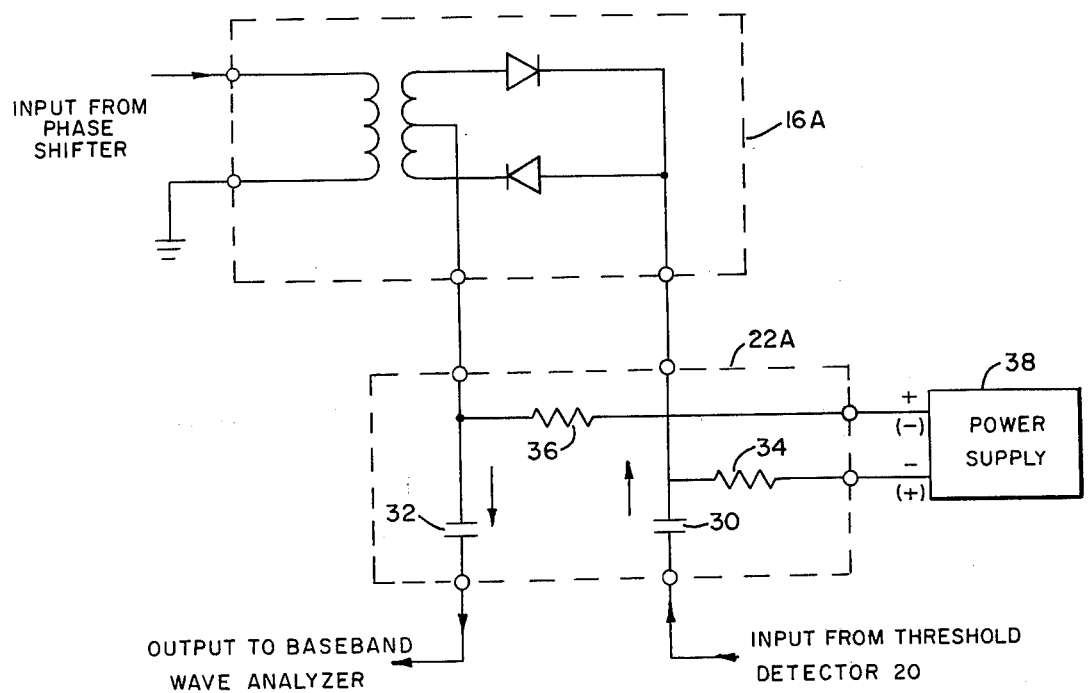
FIG. 3 is a typical single balanced phase detector biased for rejecting signal amplitude modulation.

The biasing function of phase detector 16 by bias source 22 results in improved modulation rejection ratios of up to 40 db with respect to the frequency modulation amplitudes for a single balanced phase detector as shown in FIG. 3. Single balanced detector 16A is coupled directly to phase shifter 14 to receive the reference channel signal. The signal channel input is coupled from threshold test attenuator 20 through a capacitor 30 of D.C. bias source 22A to the phase detector. Similarly, the output from phase detector 16A is coupled through a capacitor 32 of the bias source to the baseband wave analyzer equipment. As shown, bias source 22A further comprises a resistor 34 connected from one side of capacitor 30 to the negative side of a direct current power supply 38, and a resistor 36 is connected from one side of capacitor 32 to the positive side of power supply 38. The resistors are disposed for developing a direct current voltage across the diodes of the detector, biasing the diodes so that the dynamic impedance of the diode circuit approaches an ideal balance. Under these balanced conditions rejection of direct current and amplitude modulation signals is enhanced on the output of detector 16A. The alternating current path for signal flow is through capacitors 30 and 32 with no alternating current signals coupled through the high impedance of resistors 34 and 36.

Figure 4:
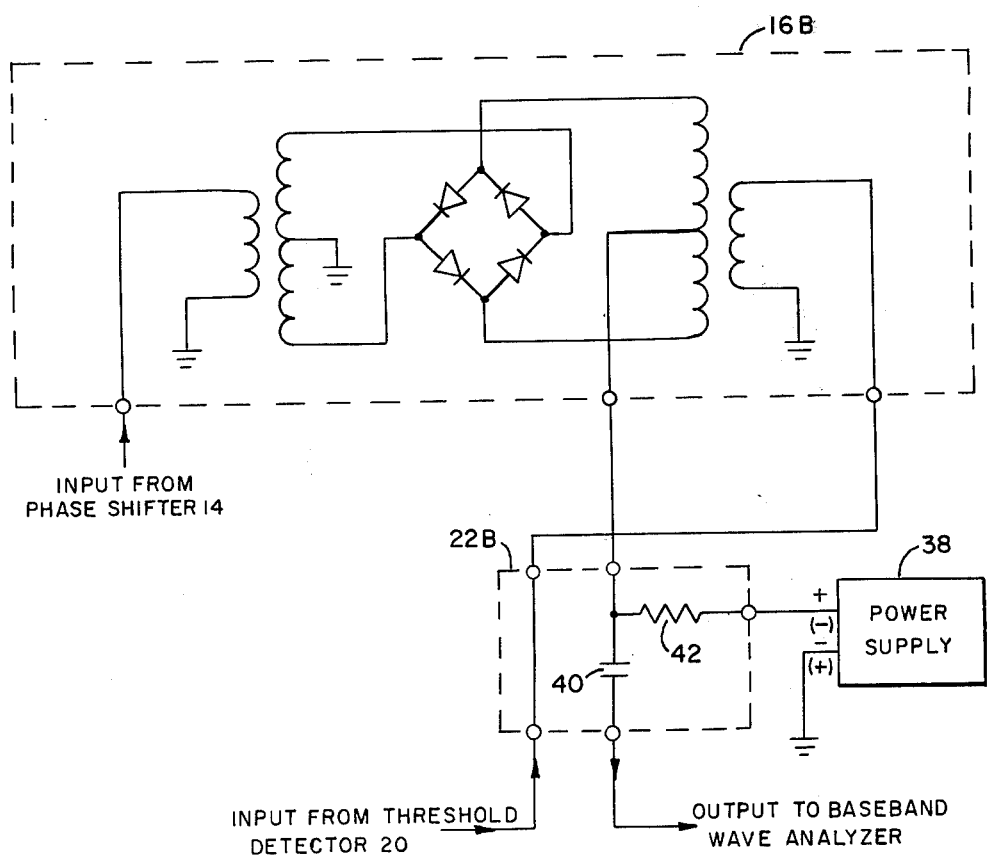
FIG. 4 is a typical double balanced phase detector biased for rejecting signal amplitude modulation.

Similarly, FIG. 4 discloses a double balanced phase detector 16B with a direct current bias source 22B to accomplish the same results. For this embodiment, the input from threshold test attenuator 20 is shown connected straight through the direct current bias source 22B with no insertion of a direct current signal thereon. The alternating current output from detector 16B is coupled through a capacitor 40 to the baseband analyzer equipment. Biasing voltage is coupled from a power supply 38 through a resistor 42 to one side of capacitor 40 and to the diodes of detector 16B for improving the dynamic impedance match of the diode bridge to enhance AM noise rejection.

Because of the inherent difference in diodes there is never a perfect balance between diode bridge arms. Biasing by the direct current voltage developed across the diodes allows the dynamic impedance to be effectively improved by adjusting the positive or negative potential supplied thereacross in a given direction. Thus, the polarity of potential supplied from power supply 38 of FIGS. 3 and 4 must be determined for each phase detector. In determining the appropriate biasing connection power supply 38 is coupled, for example, as shown in FIGS. 3 and 4. If the diode impedance balance is improved it is readily apparent by the db separation previously noted. If it is not improved the power supply output leads are merely reversed to provide the balance. Adjustment of the bias voltage over a nominal range provides varying degrees of balance.

In a practical operation it is necessary to know what the operational threshold noise is when the input signal is being analyzed. The noise threshold is established by adding sufficient attenuation into the signal channel with attenuator 20 and establishing the noise level at the output of the phase detector. Attenuation is added until additional attenuation ceases to reduce the output level from the balanced phase detector 16. Once this threshold is established, the attenuation is removed from the channel while actual signal measurements are being made. In the process of setting up the quadrature phase detection, a signal with known amplitude modulated sidebands and known frequency modulated sidebands is supplied to the discriminator. The frequency modulated signal sidebands both peak the phase detector and establish a reference level. The amplitude modulation sidebands are then minimized by adjusting bias on phase detector 16 to obtain suitable amplitude modulation rejection.

In operation, after the established calibration procedure has been accomplished, a signal under test is coupled into power divider 10. In the signal channel the signal is unaffected by attenuator 20, which provides zero attenuation, and is coupled through bias source 22 into phase detector 16 where it is mixed with the signal from the reference channel. Quadrature detector 16 responds with an output FM signal in which the analyzer system noise level has been measured and established so that the substantially pure FM signal can be accurately observed in the baseband analyzer equipment. Appropriate biasing of the phase detector increases rejection capability of amplitude modulation signals within the phase detector, reducing the AM components to a negligible level with respect to the low FM level signal. Optimum line 18 allows relatively broadband operation since signals can be selected for testing which lie on either side of the optimum frequency at which the line was established, with negligible signal degradation. This eliminates need for the narrow band cavity or lumped circuit elements as required in prior art devices.

It is established among those skilled in the art to calibrate similar systems using known FM sideband levels. There are basically two techniques in the calibration operation. A direct carrier nulling operation can be used or an indirect sideband level magnitude can be established. The direct carrier technique involves FM modulating a source with sufficient drive power to reach a condition wherein the carrier vanishes. Then adding attenuation in the modulation signal source allows a known sideband level to be established, with 40 db below the carrier at 18,600 Hz being a widely used reference. This method is used on Klystrons and similar devices which can be easily modulated by inserting the modulating source into the frequency controlling circuits.

An indirect calibration technique, which is more effective on circuits such as a highly stable crystal oscillator, is the carrier substitution method. The carrier substitution method requires that a second source which can be easily modulated be substituted for the signal source to be measured. The carrier level of the substitute source is accurately matched in frequency and amplitude to the signal source to be measured. The substitute source then provides the sidebands at known levels to accomplish the calibration. After calibration, the signal to be measured is reconnected to the calibrated analyzer and the measurement is made using the calibration set up by the substitute source.

A second indirect calibration technique, not requiring source modulation, is to place a modulating network between the source to be calibrated or measured and the analyzer for generating either angle modulated or amplitude modulated sidebands. FM sidebands are set up to establish quadrature detection on balanced phase detector 16 and to establish relative sideband calibration levels throughout the analyzer. AM sidebands are then generated by a simple phase shifting procedure within this network to allow bias adjustment setup in balanced phase detector 16. The optimum improvement ratio of the FM sidebands to AM sidebands is established by repetitively checking the FM sidebands and then checking the AM sidebands while adjusting bias source 22 until the desired results are acquired.

A related discriminator device is disclosed in a copending application Ser. No. 652,593 entitled "Optimum Threshold Transmission Line Discriminator" by J. R. Ashley, T. A. Barley, and G. J. Rast, Jr.; and in a copending application Ser. No. 652,446 entitled "Wide Operating Frequency Range Transmission Line Discriminator" by G. J. Rast, Jr., T. A. Barley, and J. R. Ashley. These copending applications were filed Jan. 26, 1976 simultaneously with applicants' application, and are assigned to the US Government as represented by the Department of the Army.

Although a particular embodiment and form of this invention has been illustrated, it is apparent that various modifications and embodiments of the invention may be made by those skilled in the art without departing from the scope and spirit of the foregoing disclosure. Accordingly the scope of the invention should be limited only by the claims appended hereto.

We claim:

1. An optimum length transmission line discriminator with low noise detection, comprising: an optimum length transmission line having an input and an output; a power divider having an input and first and second outputs, the input being disposed to receive modulation noise input signals and the first output being coupled to the transmission line input; a balanced phase detector having first and second inputs and an output, said first input being coupled to the output of said transmission line, said second input being coupled to the second output of said power divider, and said output being disposed for supplying output measurement signals therefrom; and a direct current bias source coupled to said phase detector for enhancing amplitude modulation rejection ratios of said discriminator.

2. An optimum length transmission line discriminator with low noise detection as set forth in claim 1 and further comprising: a level set attenuator and an adjustable phase shifter connected in series between the second output of said power divider and the second input of said phase detector.

3. An optimum length transmission line discriminator with low noise detection as set forth in claim 2 wherein said optimum length transmission line is a precise length of coaxial cable which provides one neper of attenuation across the electrical length of the line for a predetermined frequency.

4. An optimum length transmission line discriminator as set forth in claim 3 wherein said direct current bias source is coupled to the output of said phase detector for coupling frequency modulation signals therethrough while blocking direct current signals, and further comprising a threshold attenuator and means for coupling said attenuator between the output of said optimum line and the first input of said phase detector.

5. An optimum length transmission line discriminator as set forth in claim 4 wherein said phase detector is a single balanced phase detector; and said bias source comprises a first and a second capacitance connected to respective first and second input and output terminals respectively for coupling alternating current energy therethrough, a first resistance connected between the positive output of a direct current power supply and said first input, and a second resistance connected between the negative output of said power supply and the second output for providing biasing voltage to said phase detector, said phase detector output being coupled to the first input of said bias source, and said means for coupling said threshold attenuator to the first input of said detector being said second capacitance.

6. An optimum length transmission line discriminator as set forth in claim 4 wherein said phase detector is a double balanced phase detector and said bias source comprises a capacitance connected between an input and an output terminal for coupling alternating current signals therethrough, a resistance connected between a direct current power supply output and said input terminal for providing biasing voltage to said phase detector, said phase detector output being coupled to said bias source input terminal.

* * * * *